United States Patent [19]

Devoe et al.

[11] Patent Number: 4,792,506

[45] Date of Patent: Dec. 20, 1988

[54] POLYMERIZABLE COMPOSITIONS CONTAINING IODONIUM PHOTOINITIATORS AND PHOTOSENSITIZERS THEREFOR

[75] Inventors: Robert J. Devoe; Smarajit Mitra, both of St. Paul, Minn.

[73] Assignee: Minnesota Mining and Manufacturing Company, St. Paul, Minn.

[21] Appl. No.: 909,823

[22] Filed: Sep. 19, 1986

[51] Int. Cl.$^4$ ............................................. G03C 1/76
[52] U.S. Cl. ...................................... 430/281; 430/286; 430/905; 430/919; 522/35; 522/904; 522/905; 528/222
[58] Field of Search ............... 430/905, 919, 280, 281, 430/286; 522/35, 905, 904

[56] References Cited

U.S. PATENT DOCUMENTS

| | | | |
|---|---|---|---|
| 3,458,311 | 7/1969 | Alles | 96/35.1 |
| 4,072,527 | 2/1978 | Fan | 96/87 R |
| 4,072,528 | 2/1978 | Bratt | 96/87 R |
| 4,381,261 | 4/1983 | Bonnet | 260/162 |
| 4,451,551 | 5/1984 | Kataoka et al. | 430/270 |
| 4,608,333 | 8/1986 | Ohbayashi et al. | 430/281 |

FOREIGN PATENT DOCUMENTS 54-37182 3/1979 Japan.

*Primary Examiner*—Jack P. Brammer
*Attorney, Agent, or Firm*—Donald M. Sell; Mark A. Litman

[57] ABSTRACT

This invention describes the preparation of some new Mannich polymers and copolymers and teaches their general use as photosensitizers for onium salts for use in the initiation of free radical polymerization of vinyl monomers. These Mannich polymers are unexpectedly more efficient as photosensitizers than are the non-polymeric photosensitizers.

21 Claims, No Drawings

POLYMERIZABLE COMPOSITIONS CONTAINING IODONIUM PHOTOINITIATORS AND PHOTOSENSITIZERS THEREFOR

BACKGROUND OF THE INVENTION

Photosensitizers and photoinitiators, used for the photoinduced free radical polymerization of monomers, are important in radiation curable coatings, bulk polymerization, and the graphic arts. Polymeric photosensitizers are also known in the art. Advantages of polymeric photosensitizers and photoinitiators over low molecular weight materials are: greater processability, lower likelihood of loss of photosensitizer from photosensitive coatings through sublimation or leaching, and generally lower toxicity. Any improved efficiency in the utilization of incident light to photoinitiate polymerization allows for shorter exposure times or lower light intensities in the photocuring process, whether on a web, in solution or in graphic arts applications.

Use of polymeric photoinitiators to allow polymerization was described by Flamigni et al. [Eur. Polym. J., 20, 171 (1984)], and other examples can be found in U.S. Pat. Nos. 3,429,852 and 3,622,848.

Carbonyl containing polymeric quaternary ammonium salts as photoinitiators of polymerization have been reported by Shibanov and Protsyuk [Russian Pat. No. USSR 787,416, see Chemical Abstracts, 94, 122299r, 1981)]. Photoinitiated polymerization of methyl methacrylate with poly(methylisopropenyl ketone) was taught by Naito et al. [Kobunshi Ronbunshu 36, 777 (1979)]. Carlini et al. [Polymer, 24, 599 (1983)] cured acrylic compositions with benzophenone/dimethylaniline-substituted polymers.

Use of certain photosensitizers with onium salts for free radical generation and initiation of polymerization is also well known in the art. The technique of photogeneration of free radicals using onium salts for free radical photopolymerization and cationic photopolymerization has found applications in printing, duplication, copying, and other imaging systems—see J. Kosar in Light Sensitive Systems: Chemistry and Application of Nonsilver Halide Photographic Processes, Wiley, New York, 1965, pp 158-193. Onium salt photosensitization by polymeric photosensitizers has not previously been reported. Photosensitization of iodonium salts for free radical and cationic polymerization using low molecular weight (non-polymeric) photosensitizers has been taught in U.S. Pat. Nos. 3,729,313, 3,741,769, and 3,808,006; and in U.S. Pat. Nos. 4,026,705, 4,069,054, 4,250,053, 4,394,403 and British Pat. No. 2,070,614 respectively.

Monomeric Mannich bases used as free radical photoinitiators has been described in laid open Japanese patent application JA54-37182.

Whereas polymeric Mannich bases derived from ketones are known, (see for example Tsuchida et al. J. Polymer Sci., Letters Ed., 14, 103 (1976) and Angeloni et al. Polymer Commun., 24, 87 (1983) and references cited therein), their use as photosensitizers as taught in this invention is novel.

Thus, what the background art has not taught but what this invention teaches is the synthesis of new Mannich polymers and their general use as photosensitizers for iodonium salts for use in the initiation of free radical polymerization of vinyl monomers. Moreover, these Mannich polymers are unexpectedly more efficient as photosensitizers than are the non-polymeric photosensitizers.

SUMMARY OF THE INVENTION

It is an object of this invention to describe the preparation of Mannich polymers. It is a further object of this invention to teach the initiation of polymerization of vinyl monomers in the presence of iodonium salts sensitized by these Mannich polymers. It is still another object of this invention to indicate the coating of substrates and overcoating of coated substrates with mixtures of a combination of vinyl monomers, iodonium salts, and Mannich polymers such that exposure of these mixtures to actinic radiation provides for the resultant polymerization of the vinyl monomers. The compositions of this invention are useful in the field of graphic arts and protective coatings.

DETAILED DESCRIPTION OF THE INVENTION

This invention describes the synthesis and use of polymers or copolymers based on the Mannich reaction of polyfunctional carbonyl containing organic molecules with polyfunctional amines. The resultant polymers have been found to be efficient photosensitizers for onium salt initiation of free radical polymerization. Furthermore, the polymers of this invention are over four times as efficient as is Michler's ketone in the classical sensitization of iodonium salt initiation of acrylate free radical polymerization; see U.S. Pat. No. 4,228,232. Efficiency refers to the ability to utilize incident light to photoinitiate polymerization. Improved efficiency in the utilization of incident light to photoinitiate polymerization provides for shorter exposure times or lower light intensities or both in the photocuring process, whether on a web, in solution, neat, or in graphic arts applications.

Polymeric photosensitizers of this invention have repeating units represented by general formulae I and II below.

Polymers and copolymers having repeating units of general formula I are those, where in the final polymeric photosensitizer, the ketone function-containing group in the Mannich base condensation polymer is pendant from the main, or backbone polymer chain:

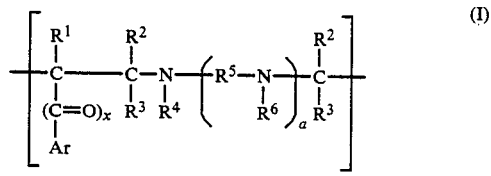

where a=0, 1, x is 1 or 2, $R^1$, $R^2$, $R^3$ may be hydrogen, alkyl, aryl, aralkyl, or alkaryl, $R^5$ is a divalent organic group or chemical bond, $R^4$ and $R^6$ are either independently alkyl, aryl, alkaryl or aralkyl groups or $R^4$ and $R^6$ together with $R^5$ and the nitrogen atoms to which $R^5$ is attached selected frpom the group consisting of heterocyclic groups and bis-heterocyclic groups forms a divalent organic group, and Ar is an unsubstituted or substituted aromatic or heteroaromatic organic group.

Polymers having the repeating units as shown in general formula II are those, where in the final polymeric photosensitizer, the ketone function-containing group in the Mannich base containing polymer is in the main chain, or backbone polymer chain,

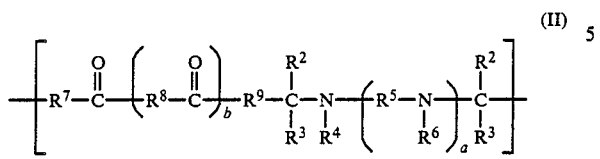
(II)

where a, $R^2$, $R^3$, $R^4$, $R^5$, and $R^6$ are as defined above; b=0, 1; $R^8$ can be a chemical bond (i.e., no atoms), or $R^8$ can be selected from alkylene, arylene or heteroarylene groups, and $R^7$ and $R^9$ are the same or different and comprise substituted or unsubstituted alkylene, arylene, alkarylene or heteroarylene groups or a monosubstituted nitrogen atom where the third atom or group to satisfy the valence of the nitrogen atom is a hydrogen atom or organic group such as $R^1$ as defined above.

There are preferred ranges and groups for each of the chemical moieties described in formulae I and II. $R^1$ is preferably selected from H, lower alkyl group (1 to 4 carbon atoms), and aralkyl of lower alkyl (1 to 4 carbon atoms) bridging moiety and phenyl, naphthyl, anthryl and phenanthryl aryl groups. $R^2$ and $R^3$ are independently selected from H, alkyl group of 1 to 20 carbon atoms (preferably lower alkyl of 1 to 4 carbon atoms), phenyl group, biphenyl group, aralkyl of lower alkyl bridging moieties (1 to 4 carbon atoms) with phenyl, naphthyl, anthryl, and phenanthryl aryl groups. $R^4$ and $R^6$ are preferably independently selected from alkyl of 1 to 20 carbon atoms, aryl of one to three fused aromatic rings (e.g., furanyl, phenyl, naphthyl, anthryl, phenanthryl), and aralkyl having 1 to 20 (preferably 1 to 4) carbon atoms in the alkyl moiety and again phenyl, naphthyl, anthryl, and phenanthryl groups. $R^4$ and $R^6$ may also form, with the included group $R^5$ and the nitrogen atom to which they are attached, 5- or 6-membered bivalent heterocyclic groups such as piperizine, bis-piperidine (including bis-piperidino alkylenes), and bis-pyrrolidine (including bis-pyrrolidino alkylenes). $R^5$ may preferably be alkylene of 1 to 20 carbon atoms or polyalkylene oxides with up to 40 backbone atoms. $R^7$ and $R^9$ may be independently selected from alkylene of 1 to 20 carbon atoms (preferably 1 to 4), arylene or heteroarylene of up to three fused rings of 5- or 6-members selected from C, N, S, O or Se. Preferably 5-membered heterocyclic and 6-membered carbocyclic aromatic rings only are used for these arylene groups. $R^8$ may be a chemical bond or may be independently selected from the same groups as $R^7$ and $R^9$.

The term group can also mean radical, for example an organic group or organic radical and the term heteroaromatic group means any aromatic radical containing one or more hetero atoms which may be the same or different and the term backbone means the main polymer chain.

In order to form a copolymer according to the present invention, one of ordinary skill in the art could add a comonomer such as a phenol or urea to the reaction mixture at about the time that the ketone is added in the synthetic procedure.

Polymeric photosensitizers of this invention represented by general formula I are prepared by the cocondensation of an organic ketone of the formula III

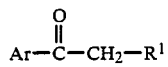
(III)

where Ar and $R^1$ are as defined above with the reaction product of two equivalents of an organic carbonyl compound having the formula $R^2$—CO—$R^3$ with one equivalent of an organic amine having the formula

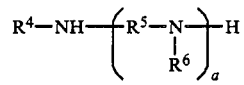

where $R^2$, $R^3$, $R^4$, $R^5$, and $R^6$ are as defined above.

Organic ketones of the formula III which may be used are acetophenone, 1- or 2-acetonaphthone, 9-acetylanthracene, 4-acetylbiphenyl, 2-, 3-, or 9-acetylphenanthrene, bromo- or chloro-substituted acetophenones, n-butyrophenone, o-, m-, or p-methoxyacetophenones, o-, m-, or p-methylacetophenones, propiophenone, valerophenone, 2-, 3-, or 4-acetylpyridine, and 3-acetylcoumarin and the like. Ar is thus shown to specifically include phenyl, naphthyl, anthryl, pyridyl, biphenyl, phenanthryl and coumarin derivatives, and may also include other aromatic and heteroaromatic groups such as organometallic aromatics (e.g., acetylferrocene, phenanthryl).

The carbonyl compound $R^2$—CO—$R^3$ may be formaldehyde (where $R^2=R^3=H$), any other organic aldehyde (where $R^2=H$ and $R^3=$alkyl, aryl, aralkyl, or alkaryl), or an organic ketone (where $R^2$ and $R^3$ are the same or different and are selected from the groups alkyl, aryl, aralkyl, or alkaryl).

While the preferred carbonyl compound of this invention is an aldehyde, formaldehyde, other examples of aldehydes that may be used in this Mannich reaction are acetaldehyde, propionaldehyde, butyraldehyde, 2-ethylbutyraldehyde, 2-methylbutyraldehyde, hexanaldehyde, heptaldehyde, valeraldehyde, isovaleraldehyde, octylaldehyde, nonylaldehyde, dodecylaldehyde, 2-methylundecanal, tetradecylaldehyde, undecylicaldehyde, and trimethylacetaldehyde.

Aromatic aldehydes useful in this reaction are benzaldehyde, o-, m-, and p-anisaldehyde, and other substituted aromatic aldehydes, 1- and 2-naphthaldehyde, 9-anthraldehyde, phenylacetaldehyde, and diphenylacetaldehyde.

Ketones that may be used in the Mannich reaction are acetone, 2-butanone, 2- or 3-pentanone, 2,- or 3-hexanone, 2-, 3-, or 4-heptanone, acetophenone, benzophenone and substituted acetophenones and benzophenones. Other aromatic ketones are 1- or 2-acetonaphthone, 9-acetylanthracene, 2-, 3-, or 9-acetylphenanthrene, 4-acetylbiphenyl, propiophenone, n-butyrophenone, valerophenone, 2-, 3-, or 4-acetylpyridine, 3-acetylcoumarin, or substituted derivatives of these ketones.

In certain cases, some aldehydes and/or ketones may exist as their more stable dimers, trimers, complexes and the like and they may be used as such. In other cases, the suitable aldehyde or ketone is generated in situ; for example formaldehyde from paraformaldehyde or 1,3,5-trioxane, and acetaldehyde from paraacetaldehyde.

A variety of primary amines, comprising alkyl-, aryl-, and aralkyl-amines for the Mannich reaction include methylamine, ethylamine, propylamine, butylamine, amylamine, hexylamine, aniline, o-, m-, and p-toluidine, 2,4-dimethylaniline, 2,3-dimethylaniline, other substituted anilines, benzylamine, substituted benzylamines, and isomeric amino-substituted pyridines. In these cases, both of the hydrogen atoms attached to the primary amine are eliminated during the cocondensation producing a polymer having the general formula I, where $a=0$ and $R^1$, $R^2$, $R^3$, $R^4$, n, and Ar are as defined above.

Preferred amines for this Mannich reaction are secondary and substituted secondary diamines of a linear or cyclic structure comprising N,N'dibenzylethylenediamine, N,N'diethyl-2-butene-1,4-diamine, N,N'diethylethylenediamine, N,N'diethyl-1,3-propanediamine, N,N'dimethylethylenediamine, N,N'dimethyl-1,6-hexanediamine, piperazine, 4,4'-trimethylenedipiperidine, 4,4'ethylenedipiperidine and the like.

Polymeric photosensitizers of this invention represented by general formula II are prepared by the cocondensation of an organic ketone of the formula IV

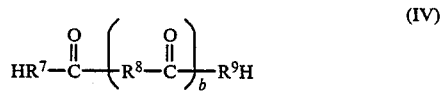
(IV)

where b, $R^7$, $R^8$, and $R^9$ are as defined above, with the reaction product of two equivalents of an organic carbonyl compound having the formula $R^2$—CO—$R^3$ with one equivalent of an organic amine having the formula $R^4$—NH—$R^5$—NH—$R^6$ and/or $R^4NH_2$ where $R^2$, $R^3$, $R^4$, $R^5$, and $R^6$ are as defined above.

Organic ketones of the general formula IV may be monoketones (b=0), such as acetone, 2-butanone, 2- or 3-pentanone, 2- or 3-hexanone, 2-, 3-, or 4-heptanone, 2,2'-, 4,4'-, or 2,4'-dihydroxybenzophenone, di-2-pyridyl ketone, di-2-furanyl ketone, di-2-thiophenyl ketone and the like. Organic ketones of the general formula IV may also be alpha-diketones ($R^8$=a chemical bond and b=1) such as 2,3-butanedione, 2,3-pentanedione, 2,3-hexanedione, 3,4-hexanedione, 2,3-heptanedione, 3,4-heptanedione, 2,3-octanedione, 4,5-octanedione, 2,2'-, 3,3'-, and 4,4'-dihydroxybenzil, furil, and di-3,3'-indolylethanedione. Organic ketones of the general formula IV may also be aralkyldiketones such as o-, m-, and p-diacetylbenzene, 1,3-, 1,4-, 1,5-, 1,6-, 1,7-, and 1,8-diacetylnaphthalene, and 1,5-, 1,8-, and 9,10-diacetylanthracene and the like.

Organic carbonyl compounds having the general formula $R^2$—CO—$R^3$ and organic amines having the general formula

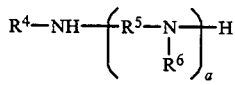

used for the preparation of compound having the general formula II are the same as defined above for the preparation of compounds having the general formula I.

Reactions for the preparation of photosensitizing polymers may be carried out in any suitable solvent or vehicle or mixture which does not adversely affect the reactants or products. Organic solvents for aldehydes and ketones used in this invention may be alcohols such as methanol, ethanol, isopropanol, and isoamyl alcohol; ethers such as tetrahydrofuran (THF) and dioxane; acetic acid, and unreactive aromatic solvents such as benzene, toluene, xylene, and the like and mixtures thereof; and dipolar aprotic solvent such as N,N-dimethylformamide (DMF), N,N-dimethylacetamide, and N-methylpyrrolidone, depending on the molecular weight and properties of the starting materials and final products.

Water is a useful solvent for those reactants that are water soluble or have some degree of solubility in water. Mixtures of water with suitable compatible organic solvents can also be used.

Reaction temperatures are generally between 40°–100° C. but preferably 60°–80° C. Reaction times for preparation of the polymeric photosensitizers of this invention vary depending on the solubility and molecular weights of the initial and final products and can range from 1 to 100 hours.

Typically, a solution of the amine in an organic solvent, such as an alcohol, is mixed with two equivalents of an organic or inorganic acid, such as acetic acid or hydrochloric acid respectively and a solution of the carbonyl compound is added to the resultant mixture either as an aqueous solution, when said carbonyl compound is soluble in water, or as a solution in an organic solvent such as alcohol, when said carbonyl compound is not soluble in water. The mixture is mechanically stirred at ambient temperature (room temperature, about 23°–25° C.) for about 8–24 hours, after which a solution of an aromatic ketone of the general formula Ar COCH$_2$R$^1$, where Ar and $R^1$ are as defined above, in an organic solvent, is added. In the case of aromatic ketones, a preferred solvent is DMF. The resultant mixture is heated at 50°–80° C., preferably at 70° C. for 10–20 hours. The polymer that is formed is caused to precipitate by the addition of an aqueous base or organic liquid in which the polymer is insoluble, for example diethyl ether. The precipitated polymer is recovered by the steps of filtering, washing, and drying.

Alternatively, polymeric photosensitizers of this invention having the general formula II can be prepared by an exchange reaction of bis(Mannich bases) represented by the general formula V with an organic amine having the formula

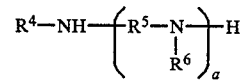

where b, $R^1$, $R^2$, $R^3$, $R^4$, $R^5$, $R^6$, and $R^8$ are defined as above, and $R^{10}$ and $R^{11}$ are either independently alkyl, aryl, alkaryl or aralkyl groups or —$R^{10}$—$R^{11}$— together forms a bivalent organic group, and are preferably selected from 1–4 carbons or where $R^{10}$ and $R^{11}$ form a piperidine ring with the included nitrogen, chosen such that the secondary amine $R^{10}$—NH—$R^{11}$ formed in the exchange reaction can be removed due to its volatility under the reaction conditions. This can be easily accomplished if the sum of carbon atoms in $R^{10}$ and $R^{11}$ is less than or equal to eight.

Bis(Mannich bases) having the general formula V are prepared as taught by R. W. Martin in U.S. Pat. No. 2,840,558.

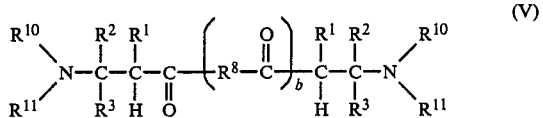

(V)

Bis(Mannich bases) having the general formula V may be alpha-diketones ($R^8$=a chemical bond, b=1) such as 1,6-bis(dimethylamino)hexane-3,4-dione, 1,6-dimorpholino-2,5-dimethyl-hexane-3,4-dione, 1,6-bis(diethylamino)-2,5-diethyl-hexane-3,4-dione, 4,4'-bis(3-diethylamino-2-methylpropionyl)benzil, and the like.

Bis(Mannich bases) may also be monoketones such as 1,5-bis(dimethylamino)-3-pentanone, 1,5-bis(dimethylamino)-2,4-dimethyl-3-pentanone, 2,6-bis(dimethylamino)-4-heptanone and the like.

Bis(Mannich bases) having the general formula V may also be aryl diketones such as 1,3-bis(3-dimethylaminopropionyl)benzene, 1,4-bis(3-morpholinopropionyl)benzene, 1,2-bis(3-dipropylaminopropionyl)benzene, 4,4'-bis(3-dibutylamino-2-methylpropionyl)biphenyl, 9,10-bis(3-pyrollidinopropionyl)anthracene, and the like.

Organic amines having the general formula

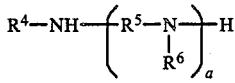

used for the preparation of compounds having the general formula II are the same as defined above for the preparation of compounds having the general formula I.

Exchange reactions for the preparation of polymeric photosensitizers of the general formula II may be carried out with or without any suitable solvent or vehicle or mixture which does not adversely effect the reactants or products. Organic solvents such as those described above for the preparation of polymeric photosensitizers of this invention are suitable for the exchange reaction, with the exception of acidic solvents such as acetic acid, which protonate the organic amine. Water is a useful solvent for those reactants that are water soluble or have some degree of solubility in water. Mixtures of water with suitable compatible organic solvents can also be used.

Reaction temperatures are generally between 40° and 250° C., but preferably 60°–80° C. Reaction times for the preparation of the polymeric photosensitizers by the exchange reaction vary depending on the solubility and molecular weights of the initial and final products and can range from 1–250 hours.

Typically, a solution of a bis(Mannich base) having the general formula V and an organic amine having the general formula

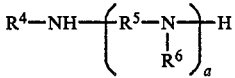

in an organic solvent such as an ether or alcohol, is heated to 60°–80° C. for 4–6 days while under a constant purge with an inert gas such as nitrogen, argon, helium, and the like, or while under reduced pressure, to remove the eliminated secondary amine $R^{10}$—NH—$R^{11}$, replenishing any evaporated solvent with fresh solvent regularly. The polymer that is formed is isolated by evaporation of the solvent to cause phase separation or by causing the polymer to precipitate by addition of an organic liquid in which the polymer is insoluble, for example diethyl ether. The precipitated polymer is recovered by the steps of filtering, washing and drying.

Photosensitive compositions employing the polymeric photosensitizers of this invention are prepared from solutions of optionally, a polymeric binder, 0–500 parts by weight, for example of polystyrene, polyacrylates, polymethacrylates, and the like, a photocrosslinkable multifunctional monomer, 50–950 parts by weight, for example of pentaerythritol tetraacrylate, or other multifunctional acrylates, a photoinitiator such as diaryliodonium salts, particularly diphenyliodonium salts, 1–100 parts by weight, the polymeric photosensitizer of this invention, 1–50 parts by weight, and optionally, solvent, 0–900 parts by weight. Suitable solvents include 2-butanone, tetrahydrofuran, acetone, aromatic hydrocarbons, chlorinated hydrocarbons, and solvents previously mentioned. Such photosensitive compositions can be coated or used as prepared with or without deoxygenation by purging with an inert gas, for example, nitrogen or argon. Iodonium salts are preferred and are well known in the literature as represented by U.S. Pat. Nos. 3,729,313; 3,741,769; 3,808,006; 4,250,053 and 4,394,403.

The present invention provides a means for photopolymerizing vinyl monomers in solution or neat. When used for polymerization in solution or neat, it is useful to describe the efficiency or photosensitivity of the composition in terms of the amount of light required to cause the sample to reach the gel point, which is defined as the stage at which a liquid begins to exhibit elastic properties and increased viscosities (see the Dictionary of Science and Technology S. P. Parker, 3rd ed., McGraw-Hill, N.Y., 1984, p. 673). Under conditions where samples of equal optical density are irradiated with the same lamp at the same distance the length of time required to reach the gel point, designated hereinafter as the gel time, is inversely proportional to the efficiency for causing polymerization; efficiency being the ability to utilize incident light to photoinitiate polymerization, in this case, measured by gel time. In this invention, a Blak-Ray® lamp (model XX-15, Ultra-Violet Products, Inc., San Gabriel, Calif.) with two 15 watt BLB General Electric bulbs, 366 nanometers primary wavelength, was used for exposing samples to irradiation at a distance of 12 cm.

Gel times are taken as the exposure time required to prevent a solution from flowing in a 13 mm outside diameter Pyrex test tube when inverted. This point is usually reached concomitantly with a precipitous change in the transmittance of visible light, the solution becoming cloudy and opaque. The gel times vary from 5 seconds to 40 minutes, depending on the optical density, light intensity, distance from the exposure source, and the relative amounts of photoinitiator, monomer, solvent, binder, and deoxygenation. Polymeric photosensitizers of this invention have gel times one to one-fourth those of the commonly used non-polymeric photosensitizers, Michler's ketone.

Photosensitizer coating solutions employing these polymeric photosensitizers are prepared from solutions of a photocrosslinkable multifunctional monomer, for example pentaerythritol tetraacrylate, or other multifunctional acrylates, a photoinitiator like a diaryliodonium salt, and a polymeric photosensitizer of this invention. An additional component is desired in some constructions. That component is a polymeric binder, for example polystyrene, acrylates, methacrylates and the like. Other adjuvants such as filler (glass bubbles, silica), pigments, surfactants, coating aids, and the like may be used.

The present invention provides articles including photosensitive coatings and overcoatings on organic and inorganic substrates to give films, composites, or layered structures. These coatings and overcoatings may be applied by methods known in the art such as bar, knife, reverse roll, knurled roll, or spin coatings, or by dipping, spraying, brushing, curtain coating and the like. Preparation of the coatings and overcoatings of this invention involves several steps.

First, a suitable photosensitive coating solution is coated on a substrate such as a polyvinylidene chloride-primed polyester film, as known in the art, and allowed to dry. Other flexible substrates that can be used are plastics such as primed polyethylene and polypropylene, and metal foils, and rigid substrates such as glass, aluminized metal, and aluminum can be used. A suitable solvent for such solutions is 2-butanone. Other organic solvents that are useful for preparing photosensitive coatings are THF, acetone, aromatic hydrocarbons, chlorinated hydrocarbons, dioxane, and solvents previously mentioned.

Second, the resultant dried photosensitive coating can be optionally overcoated with a poly(vinyl alcohol) coating or other coatings which serve as oxygen barriers. Such techniques are shown in U.S. Pat. Nos. 3,458,316; 4,072,528 and 4,072,527. The poly(vinyl alcohol) overcoating is prepared by coating an aqueous solution of polyvinylalcohol onto a photosensitive layer. The resultant overcoated film or composite is dried and then exposed to radiation of a suitable wavelength for a suitable length of time. Usually 30 seconds is the preferred length of time although the exposure time can be from 1 to 1000 seconds depending on the desired extent of cure.

Any suitable source which emits ultraviolet light may be used to activate the photosensitizers in the practice of this invention. Suitable sources are mercury arcs, carbon arcs, low-, medium-, and high-pressure mercury lamps, plasma arcs, ultraviolet light-emitting diodes and ultraviolet emitting lasers. In this invention, exposure to ultraviolet light of the composite was conducted in a Berkey Ascor exposure unit using two kilowatts (kw) of power. The resultant negative images obtained were developed by rinsing the exposed composite with water for the removal of polyvinyl alcohol followed by rinsings with 2-butanone to remove unexposed photosensitive coating. A comparison of the photographic speed as measured using a 21 step (square root of two) sensitivity guide shows comparable speeds of photosensitive coatings made according to this invention compared to those photosensitive coatings that contained commercially available photoinitiators (for example, Irgacure 651, benzil dimethyl ketal, commercially available from Ciba-Geigy, Ardsley, NY). In regard to the sensitivity guide, more steps mean more sensitivity in negative working imaging systems.

Objects and advantages of this invention are further illustrated by the following examples, but the particular materials and amounts thereof recited in these examples, as well as other conditions and details, should not be construed to unduly limit this invention.

EXAMPLES

In the following examples, parts are reported as parts by weight unless indicated otherwise, and polymer structures were confirmed spectroscopically.

EXAMPLE 1

The following example is typical for the preparation of polymer of general structure I, where $R^1=R^2=R^3=H$, $R^4-R^6=CH_2-CH_2-$, $R^5=-CH_2-CH_2-$, $a=x=1$ and $Ar=C_6H_5$.

To a mixture of 19.4 parts of piperazine hexahydrate in 20 parts methanol was added slowly 12 parts of glacial acetic acid. After addition was complete, the precipitated salt was redissolved when 16.2 parts of 37% aqueous formalin was added. The clear solution was allowed to stir on an ice bath for an hour and then at room temperature overnight.

A solution was made of 12 parts of acetophenone in 20 parts of N,N-dimethylformamide, and to this solution was added, dropwise with stirring, the solution prepared above. After the addition was complete, the mixture was heated at 70° C. under nitrogen for 16 hours. The solution was diluted with water and poured into 500 parts of aqueous sodium hydroxide (1.0M) to precipitate the polymer. The polymer was separated by filtration and purified by reprecipitation from a N,N-dimethylformamide solution into water, filtering and drying. The structure of the polymer is given by repeating units of

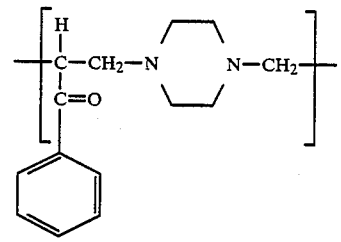

EXAMPLE 2

The following example is typical for the preparation of polymer of general structure I, where $R^1=R^2=R^3=H$, $R^4-R^6=CH_2-CH_2-$, $R^5=-CH_2-CH_2-$, $a=x=1$ and $Ar=2-C_{10}H_7$.

To a mixture of 9.7 parts of piperazine hexahydrate and 10 parts of methanol was added 6 parts of glacial acetic acid. After addition was complete, the precipitated salt was redissolved when 8.1 parts of 37% aqueous formalin was added to it. The mixture was stirred for 6 hours and then added slowly to a stirred solution of 8.5 parts of 2-acetonaphthone in 20 parts of N,N-dimethylformamide. The clear solution was heated at 70° C. for 16 hours. The solution was then poured into 400 parts of aqueous sodium hydroxide, the precipitate was recovered by decantation of the supernatant, redissolved in a mixture of N,N-dimethylformamide/tetrahydrofuran and reprecipitated in water. The product was recovered by filtration and was washed and dried. The structure of this polymer is given by the repeating units

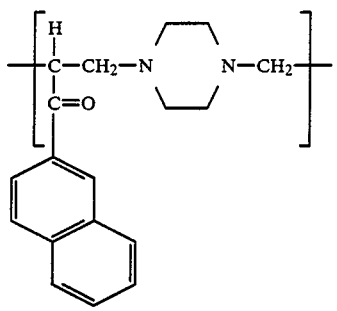

EXAMPLE 3

The following example is typical for the preparation of polymer of general structure I, where $R^1=R^2=R^3=H$, $R^4-R^6=-CH_2-CH_2-$, $R^5=-CH_2-CH_2-$, $a=1$, $x=2$, and $Ar=C_6H_5$.

To a mixture of 9.7 parts of piperazine hexahydrate and 10 parts of methanol was added 6 parts of glacial acetic acid. After addition was complete, the precipitate was redissolved when 8.1 parts of 37% aqueous formalin was added to it. The mixture was stirred for 17 hours and then added slowly to a stirred solution of 7.4 parts of 1-phenyl-1,2-propanedione in 20 parts of N,N-dimethylformamide. The clear solution was heated at 70° C. under nitrogen for 20 hours. The solution was then poured into 400 parts of aqueous sodium hydroxide solution and the precipitated product was recovered by filtration. The product was washed with water until the washings were neutral and then dried. The structure of the polymer is given by the repeating unit

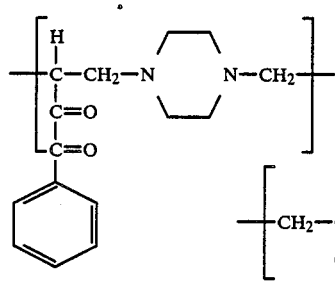

EXAMPLE 4

The following example is typical for the preparation of polymer of general structure II where $R^2=R^3=H$, $R^4-R^6=-CH_2-CH_2-$, $R^5=-CH_2-CH_2-$, $R^7=R^9=-CH_2-$, $R^8=$zero, $a=1$, and $b=1$.

To a mixture of 9.7 parts of piperazine hexahydrate and 10 parts of methanol was added 6 parts of glacial acetic acid. After addition was complete, the precipitated salt was redissolved when 8.1 parts of 37% aqueous formalin was added to it. The mixture was stirred for 26 hours and then added slowly to a solution of 4.3 parts of 2,3-butanedione in 10 parts of N,N-dimethylformamide. The mixture was heated at 70° C. under nitrogen for 16 hours. The reaction mixture was poured into diethyl ether and the gummy product was separated by decantation, redissolved in methanol and reprecipitated into ethyl acetate. The polymer was separated by filtration and washed with ethyl acetate and dried. The structure of this polymer is given by the repeating units of

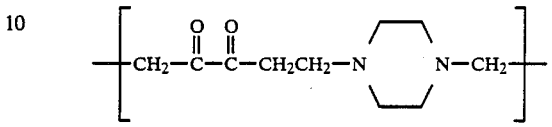

EXAMPLE 5

The following example is typical for the preparation of polymer of general structure II where $R^2 = R^3 = H$, $-NR^4-(R^5-NR^6)_a =$

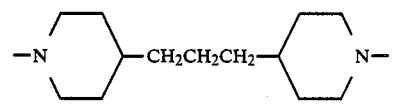

$R^7 = R^9 = CH_2$, $R^8 = C_6H_4$, and $b = 1$.

To a mixture of 4.2 parts 1,3-dipiperidylpropane and 8 parts of methanol was added 2.4 parts of glacial acetic acid. After the addition was complete 3.24 parts of a 37% aqueous formalin solution was mixed in and the resultant solution was stirred at room temperature for 6 hours. The mixture was then added to a solution of 3.24 parts of p-diacetylbenzene in 5 parts of N,N-dimethylformamide. This final mixture was heated at 70° C. for 16 hours. The viscous reaction mixture was poured into aqueous sodium hydroxide solution to precipitate the polymer, filtered and dried. The structure of the resultant polymer is given by the repeating units of

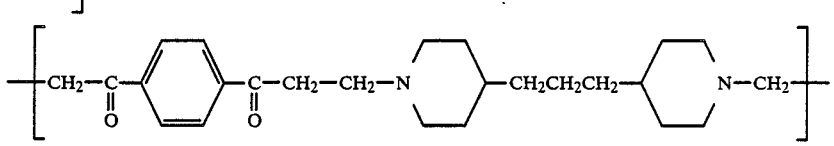

EXAMPLE 6

The following example is typical for the preparation of polymer of general structure II where $R^2 = R^3 = H$, $-NR^4-(R^5-NR^6)_a =$

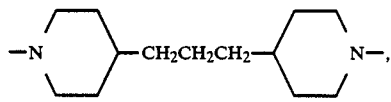

$R^7 = R^9 =$ 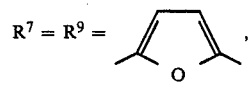, $R^8 =$ zero (a chemical bond), and $b = 1$.

To a mixture of 4.2 parts of 1,3-dipiperidylpropane in 8 parts of methanol was added 2.4 parts of glacial acetic acid. After the addition was complete, 3.3 parts of a 37% aqueous formalin solution was added and the mixture was stirred at room temperature for 8 hours. A mixture of 3.8 parts of furil and 20 parts of N,N-dimethylformamide was added to the above solution and this mixture was heated at 70° C. for 8 hours. The dark reaction mixture was poured into a large excess of diethyl ether and the precipitate was separated by decantation, redissolved in methanol and reprecipitated into ethyl ether. The precipitate was separated by filtration and dried under vacuum to give a pure polymer of the structure represented by the repeating units of 1.25 parts of 1,3-bis(dimethylaminopropionyl)benzene and 0.83 parts of dodecylamine were combined and dissolved in 16.5 parts of 10:1 dioxane:water (volume:volume). The solution was heated to 60° C. in an oil bath with stirring while passing argon over the solution for 5 days. The evaporated solvent was replenished with fresh solvent regularly. The polymer was isolated by evaporating the solvent and drying in a vacuum oven for 3 hours to yield 1.8 parts product which was identified spectroscopically as a polymer having repeating units of

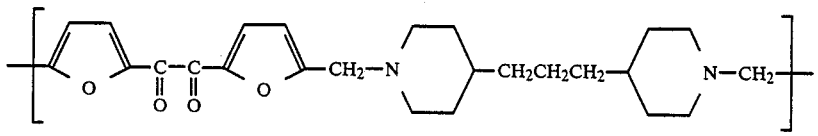

EXAMPLE 7

The following example is typical for the preparation of a polymer represented by general formula II, where $R^2=R^3=H$, $R^4=n-C_{12}H_{25}$, $R^8=p-C_6H_4$, $R^7=R^9=CH_2$, a=0, and b=1.

1.25 parts of 1,4-bis(3-dimethylaminopropionyl)benzene and 0.83 parts of dodecylamine were combined and dissolved in 16.5 parts of 10:1 dioxane:water (volume: volume). The solution was heated to 60° C. in an oil bath with stirring while passing argon over the solution for 5 days. The evaporated solvent was replenished with fresh solvent regularly. The polymer was isolated by evaporating the solvent and drying in a vacuum oven for 3 hours to yield 1.45 parts of polymer, identified spectroscopically as a polymer having repeating units of the structure:

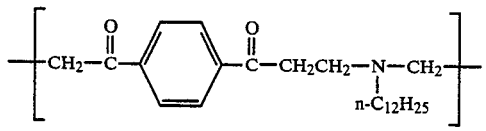

EXAMPLE 8

The following example is typical for the preparation of a polymer having the general formula II, where $R^2=R^3=H$, $R^4=n-C_{12}H_{25}$, $R^8=m-C_6H_4$, $R^7=R^9=CH_2$, a=0, and b=1.

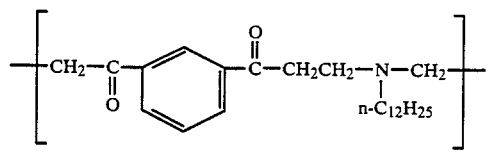

EXAMPLE 9

The following example compares the photosensitizers of this invention with state-of-the-art monomeric photosensitizers in solution polymerization of pentaerythritol tetraacrylate.

A stock solution of 5 parts of pentaerythritol tetraacrylate, 44.5 parts of methyl ethyl ketone (unless otherwise indicated in Table 1), and 0.5 parts of diphenyliodonium hexafluorophosphate was prepared. To 3 ml aliquots of the stock solution was added sufficient sensitizer (Table 1) to adjust the absorbance at 366 nm to 0.051±0.004 vs stock solution in a 1 cm. path length cell. After transferring to 13 mm Pyrex test tubes and deoxygenating by nitrogen purge for 10 minutes, each sample was irradiated using a Blak-Ray ® lamp (Model XX-15, Ultra-Violet Products, Inc., San Gabriel, Calif., primary wavelength 366 nm) with 15 watt BLB General Electric Company bulbs at a distance of 12 cm. The time required to cause each sample to gel (no flow, opaque) was recorded and is reported in Table 1. The data show that the Mannich polymers of this invention are better sensitizers (shorter gel times) than any of the monomeric photosensitizers, including the standard photosensitizer, Michler's ketone.

TABLE 1

| Photosensitizer No. | For synthesis, see Example No. | Gel time (in minutes) |
|---|---|---|
| 1. Michler's ketone | | 6.5 |
| 2. Acetophenone | | 13.8 |
| 3. 2-Acetonaphthone | | 13.5 |
| 4. $C_6H_5-C(=O)-CH_2CH_2-N\text{(piperazine)}N-CH_3$ | | 3.42 |

TABLE 1-continued

| Photosensitizer No. | For synthesis, see Example No. | Gel time (in minutes) |
|---|---|---|
| 5. [structure: naphthyl-C(=O)-CH2CH2-N(piperazine)N-CH3] | | 3.25 |
| 6. [structure: polymer with -CH2-N(piperazine)N-, C=O, C6H5] | 1 | 1.50[a] |
| 7. [structure: polymer with naphthyl-C=O and piperazine] | 2 | 1.50[a] |
| 8. [structure: polymer with -C(=O)-C(=O)- and piperazine] | 4 | 1.75[b,c] |
| 9. [structure: polymer with furan-C(=O)-C(=O)-furan and bipiperidine] | 6 | 7.0[b,d] |
| 10. [structure: polymer with -C(=O)-C6H4-C(=O)- para, and N-n-C12H25] | 7 | 5.75[b] |
| 11. [structure: polymer with -C(=O)-C6H4-C(=O)- meta, and N-n-C12H25] | 8 | 5.33[b] |
| 12. 1:1 mixture of samples 6 and 7 | 1,2 | 4.5[a] |

[a] polymeric photosensitizer numbers 6 and 7 correspond to Mannich polymers having general formula I
[b] polymeric photosensitizers numbers 8–11 correspond to Mannich polymers having general formula II
[c] Solvent was 1 drop trifluoroacetic acid in 3.0 ml methanol. Sensitizer No. 1 (Michler's ketone) gel time in this solvent is 3.5 minutes.
[d] Solvent was 1 drop trifluoroacetic acid in 3.0 ml methyl ethyl ketone.

EXAMPLE 10

The following example extends the application of the polymeric photosensitizers of this invention to films.

Photosensitive films were prepared by bar coating (#20 wire-wound bar) polyvinylidene chloride-primed polyester film (3M film MF 477400, 3M, St. Paul, MN) using a solution of 0.01 part photosensitizer No. 6 (TABLE 1), 0.05 part diphenyliodonium hexafluorophosphate, 0.44 part pentaerythritol tetraacrylate, 0.50 part polystyrene (Aldrich Chemical Co., Milwaukee, Wis., molecular weight 22,000) which serves as a binder, and 4.5 parts methyl ethyl ketone. The coating was dried with a heat gun, then in an oven at 50° C. for two minutes. An oxygen barrier coating of 1 part polyvinyl alcohol (Aldrich Chemical Co., Milwaukee, Wis., molecular weight 2,000, 75% hydrolyzed), 0.02 part 10% aqueous solution of Triton X100 (Rohm and Haas Co., Philadelphia, Pa.), and 20 parts water was applied over the first coatin using a #8 wire-wound bar and dried as with the first coating. Exposure was made with UV light in a 2 kw Berkey-Ascor exposure unit with a mercury arc for 30 seconds through a 21 step (square root of two) sensitivity guide. The negative image was developed by rinsing the exposed sample with water for 10 seconds (to remove polyvinyl alcohol topcoat) followed by a methyl ethyl ketone rinse for 15 seconds (to remove the unexposed areas of the coating), leaving 8 steps adhered to the polyester. Substitution of commercial Irgacure 651 (Ciba-Geigy Corp., Ardsley, N.Y.) for polymeric photosensitizer No. 6 and diphenyliodonium hexafluorophospate left 11 steps, comparable to the 8 steps from polymeric photosensitizers of this invention.

EXAMPLE 11

The purpose of this example is to show that the polymeric photosensitizers of this invention fall outside of the specifications of photosensitizers for iodonium salts described in U.S. Pat. Nos. 3,729,313, 3,741,769, and 3,808,006.

A solution of 5 parts 5% weight/volume Butvar B76 (Shawinigan Resins Co., Springfield, Mass.), 0.3 part trimethylolpropane trimethacrylate, 0.03 part 2-methyl-4,6-bis(trichloromethyl)-s-triazine, and 0.01 part polymeric photosensitizer number 6 of this invention was knife coated on 3 mil polyvinylidene chloride-primed polyester film using a 2 mil orifice. The coating was air-dried for 40 minutes. A second 3 mil polyvinylidene chloride-primed polyester film was placed over the dry, tacky coating. The resultant sandwich construction was then exposed through a #1-T Resolution Guide (Stouffer Graphic Arts Equipment Co., South Bend, Ind.) for 3 minutes to 15,000 foot candles of incident light from a tungsten light source providing light in the visible and ultraviolet range (3M quartz-iodine lamp, #78-8454-3463-4E, 3M, St. Paul, MN). The cover film was removed and the coating was treated with black toner powder (#78-6969-5581-0, 3M, St. Paul, MN), yielding no visible image.

What is claimed is:

1. A photopolymerizable composition comprising an ethylenically unsaturated vinyl polymerizable material, an iodonium photoinitiator, and a polymeric photosensitizer for said photoinitiator, said polymeric photosensitizer containing a photosensitizationally effective amount of repeating units of either of the formulae:

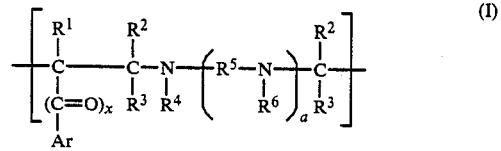

and

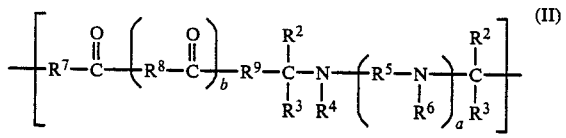

wherein
a is selected from the group consisting of 0 or 1,
x is selected from the group consisting of 1 and 2,
b is selected from the group consisting of 0 and 1,
$R^1$, $R^2$ and $R^3$ are independently selected from the group consisting of H, alkyl, aryl, alkaryl and aralkyl groups,
$R^4$ and $R^6$ are independently selected from the group consisting of alkyl, aryl, alkaryl and aralkyl groups, and wherein $R^4$ and $R^6$ together may form a bivalent organic group, along with atoms from $R^5$ and the nitrogen atoms attached to $R^5$, selected from the group consisting of a heterocyclic group or bis-heterocyclic group, $R^5$ is a divalent organic group or chemical bond,
$R^7$ and $R^9$ are independently selected from the group consisting of alkylene, arylene, alkarylene and heteroarylene group, or a monosubstituted nitrogen atom wherein the substitution on said nitrogen is selected from H, alkyl, aryl, alkaryl, or aralkyl, and
$R^8$ is selected from a chemical bond and from the group consisting of alkylene, arylene, alkarylene and heteroarylene groups.

2. The photopolymerizable composition of claim 1 having structural formula (I) wherein $R^1$, $R^2$ and $R^3$ are independently selected from the group consisting of H and alkyl groups of 1 to 20 carbon atoms.

3. The photopolymerizable composition of claim 1 having structural formula (II) wherein $R^1$, $R^2$ and $R^3$ are independently selected from the group consisting of H and alkyl groups of 1 to 20 carbon atoms.

4. The photopolymerizable composition of claim 1 having structural formula (I) wherein $R^1$, $R^2$ and $R^3$ are independently selected from the group consisting of H, alkyl groups of 1 to 20 carbon atoms, phenyl group, biphenyl group, and aralkyl of 1 to 20 carbon atoms in the alkyl moiety thereof and wherein the aryl moiety thereof is selected from the group consisting of phenyl, naphthyl, anthryl and phenanthryl groups.

5. The photopolymerizable composition of claim 1 having structural formula (II) wherein $R^1$, $R^2$ and $R^3$ are independently selected from the group consisting of H, alkyl groups of 1 to 20 carbon atoms, phenyl group, biphenyl group, and aralkyl of 1 to 20 carbon atoms in the alkyl moiety thereof and wherein the aryl moiety thereof is selected from the group consisting of phenyl, naphthyl, anthryl and phenanthryl groups.

6. The photopolymerizable composition of claim 1 having structural formula (I) wherein $R^4$ and $R^6$ are independently selected from alkyl of 1 to 20 carbon atoms, aryl of one to three fused rings, and aralkyl having 1 to 20 carbon atoms in the alkyl moiety thereof and wherein the aryl moiety thereof is selected from phenyl, naphthyl, anthryl and phenanthryl, or wherein $R^4$ and $R^6$ together with atoms from $R^5$ and the nitrogen atoms attached to $R^5$ form 5- or 6-membered heterocyclic groups selected from piperizine, bis-piperidine, and bis-pyrrolidine.

7. The photopolymerizable composition of claim 1 having structural formula (II) wherein $R^4$ and $R^6$ are independently selected from alkyl of 1 to 20 carbon atoms, aryl of one to three fused rings, and aralkyl having 1 to 20 carbon atoms in the alkyl moiety thereof and wherein the aryl moiety thereof is selected from phenyl, naphthyl, anthryl and phenanthryl, or wherein $R^4$ and $R^6$ together with atoms from $R^5$ and the nitrogen atoms attached to $R^5$ form 5- or 6-membered heterocyclic groups selected from piperizine, bis-piperidine, and bis-pyrrolidine.

8. The photopolymerizable composition of claim 3 wherein $R^4$ and $R^6$ are independently selected from alkyl of 1 to 20 carbon atoms, aryl of one to three fused rings, and aralkyl having 1 to 20 carbon atoms in the alkyl moiety thereof and wherein the aryl moiety thereof is selected from phenyl, naphthyl, anthryl and phenanthryl, or wherein $R^4$ and $R^6$ together with atoms from $R^5$ and the nitrogen atoms attached to $R^5$ form 5- or 6-membered heterocyclic groups selected from piperizine, bis-piperidine, and bis-pyrrolidine.

9. The photopolymerizable composition of claim 4 wherein $R^4$ and $R^6$ are independently selected from alkyl of 1 to 20 carbon atoms, aryl of one to three fused rings, and aralkyl having 1 to 20 carbon atoms in the alkyl moiety thereof and wherein the aryl moiety thereof is selected from phenyl, naphthyl, anthryl and phenanthryl, or wherein $R^4$ and $R^6$ together with atoms from $R^5$ and the nitrogen atoms attached to $R^5$ form 5- or 6-membered heterocyclic groups selected from piperizine, bis-piperidine, and bis-pyrrolidine.

10. The photopolymerizable composition of claim 8 wherein $R^5$ is selected from the group consisting of 1 to 20 carbon atoms and polyalkylene oxides of up to 40 backbone atoms.

11. The photopolymerizable composition of claim 9 wherein $R^7$ and $R^9$ are independently selected from the group consisting of alkylene of 1 to 20 carbon atoms, arylene of up to three fused rings, or heteroarylene of up to three 5- or 6-membered fused rings whose backbone atoms consist of only C, N, S, O and Se atoms.

12. The composition of claim 1 wherein said photoinitiator comprises a photosensitive diaryliodonium free radical initiator.

13. The composition of claim 2 wherein said photoinitiator comprises a photosensitive diaryliodonium free radical initiator.

14. The composition of claim 3 wherein said photoinitiator comprises a photosensitive diaryliodonium free radical initiator.

15. The composition of claim 7 wherein said photoinitiator comprises a photosensitive diaryliodonium free radical initiator.

16. The composition of claim 1 further comprising a polymeric binder.

17. The composition of claim 2 further comprising a polymeric binder.

18. The composition of claim 3 further comprising a polymeric binder.

19. A photopolymerizable composition comprising an ethylenically unsaturated vinyl polymerizable material, an iodonium photoinitiator, and a polymeric photosensitizer for said photoinitiator, said polymeric photosensitizer containing a photosensitizationally effective amount of repeating units of either of the formulae:

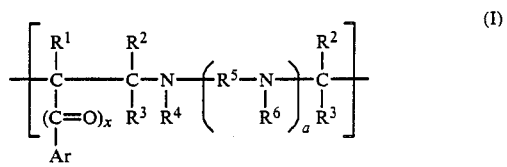

and

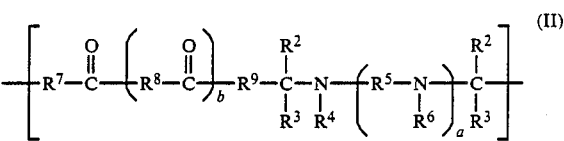

wherein
a is selected from the group consisting of 0 or 1,
x is selected from the group consisting of 1 and 2,
b is selected from the group consisting of 0 and 1,
$R^1$, $R^2$ and $R^3$ are independently selected from the group consisting of H, alkyl, aryl, alkaryl and aralkyl groups,
$R^4$ and $R^6$ are independently selected from the group consisting of alkyl, aryl, alkaryl and aralkyl groups, and wherein $R^4$ and $R^6$ together may form a bivalent organic group, along with atoms from $R^5$ and the nitrogen atoms attached to $R^5$, selected from the group consisting of a heterocyclic group or bis-heterocyclic group,
$R^5$ is a divalent organic group or chemical bond,
$R^7$ and $R^9$ are independently selected from the group consisting of alkylene, arylene, alkarylene and heteroarylene group, or a monosubstituted nitrogen atom wherein the substitution on said nitrogen is selected from H, alkyl, aryl, alkaryl, or aralkyl, and
$R^8$ is selected from a chemical bond and from the group consisting of alkylene, arylene, alkarylene and heteroarylene groups,
said iodonium photoinitiator being present in an amount equal to 0.1 to 10% by weight of said ethylenically unsaturated polymerizable material and said polymeric photosensitizer being present in range of 1 to 100% by weight of said onium photoinitiator.

20. The composition of claim 19 wherein said photoinitiator comprises a photosensitive diaryliodonium free radical initiator.

21. The composition of claim 19 further comprising a polymeric binder.